(12) United States Patent
Maltabes et al.

(10) Patent No.: US 6,737,205 B2
(45) Date of Patent: May 18, 2004

(54) ARRANGEMENT AND METHOD FOR TRANSFERRING A PATTERN FROM A MASK TO A WAFER

(75) Inventors: John George Maltabes, Austin, TX (US); Alain Bernard Charles, Singapore (SG); Karl E. Mautz, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 128 days.

(21) Appl. No.: 10/135,463

(22) Filed: Apr. 30, 2002

(65) Prior Publication Data

US 2003/0202181 A1 Oct. 30, 2003

(51) Int. Cl.$^7$ ................................................. G03F 9/00
(52) U.S. Cl. ............................................. 430/22; 430/5
(58) Field of Search ....................................... 430/5, 22

(56) References Cited

U.S. PATENT DOCUMENTS

| 5,627,624 A | 5/1997 | Yim et al. ..................... 355/53 |
| 5,910,847 A | 6/1999 | Van der Werf et al. ..... 356/401 |
| 6,279,147 B1 | 8/2001 | Buynoski et al. ............. 716/19 |

*Primary Examiner*—Christopher G. Young
(74) *Attorney, Agent, or Firm*—Kim-Marie Vo

(57) ABSTRACT

An arrangement for transferring a pattern from a mask (100) onto a wafer is provided. A product area (110) of the mask (100) is at least partly surrounded by a frame (112) having an alignment mark area (114). In order to avoid the need to produce a specific mask set for different alignment styles, the mask (100) and the frame (112) are designed as being separate units. Further, methods for transferring a pattern from a mask to a wafer are provided that employ a frame separated from a product area.

18 Claims, 3 Drawing Sheets

ARRANGEMENT AND METHOD FOR TRANSFERRING A PATTERN FROM A MASK TO A WAFER

FIELD OF THE INVENTION

The present invention generally relates to an arrangement and method for transferring a pattern from a mask to a wafer, and more particularly to an arrangement and method for an alignment optimization in optical lithography.

BACKGROUND OF THE INVENTION

The fabrication of microcircuit devices on a semiconductor wafer involves transferring patterns from (photo) lithographic masks to the semiconductor wafer. When transferring the pattern, it is important to have a proper alignment between the mask and the semiconductor wafer to properly match and override the device features of the semiconductor wafer at the different production steps. In particular, the alignment becomes more important as device and feature sizes decrease in the semiconductor industry. In general, alignment mark areas, which are distinct from product areas, are provided on the semiconductor wafer and mask. The alignment process is performed on the basis of the alignment marks positioned in the alignment mark areas.

Due to the effect of previous processing schemes, such as chemical-mechanical polishing (CMP) or etch processing on lithography alignment marks, the alignment accuracy can be degraded. Also film deposition processing may impact the alignment quality as an additional effect. If the alignment mark areas are located in the kerf (scribe grid) region, these marks also can be subject to undesirable etch loading effects (i.e. global and local density variations) from pattern density changes, i.e. there are pattern features that are etched more severely than others.

Thus, it is useful to employ various designs and/or sizes of alignment marks for different processes in order to minimize the degradation of the alignment accuracy. For newly introduced devices or changes in process technology, for example CMP, there is a need for optimizing new alignment marks or to study the effects of process changes on the alignment marks.

It has already been suggested that specific test masks or test reticles are used. U.S. Pat. No. 5,910,847 describes a test mask with a pattern to measure the uniformity of radiation in two direction. U.S. Pat. No. 5,627,624 teaches a test reticle with a number of orthogonal arranged alignment marks and an alignment mark size optimization method. U.S. Pat. No. 6,279,147 discloses a test mask having a test pattern portion within an existing product mask pattern.

However, these test reticles produced false results, mainly due to the absence of product features. Further, the integration, i.e. the combination of multiple processes within a series of different processes, such as etch, CMP or film deposition has a large influence on the alignment mark effectiveness, accuracy and repeatability of aligning. Such influence cannot be simulated by the above mentioned specific test reticles.

In other cases, test features are added to the kerf region in order to test, for example, electrical features or critical dimension features, like thickness or line width. These additional targets lead to problems due to an increasingly limited kerf area region.

Another way to test different types of alignment marks is the production of multiple masks and to determine which mask gives the best result. Such a production of multiple masks is, however, very expensive. The costs are particularly high when advanced masks (e.g. for masks using optical proximity correction or phase shifting) are used. Also, the increased application of reticles, which are particularly expensive, increases the costs when multiple masks are made.

The present invention seeks to solve the above-mentioned problems and to provide arrangements and methods that allow the optimization of alignment mark design without the need to produce multiple masks at high costs. A main object of the invention is an improvement in alignment accuracy.

DETAILED DESCRIPTION OF THE DRAWINGS

Figure 1:
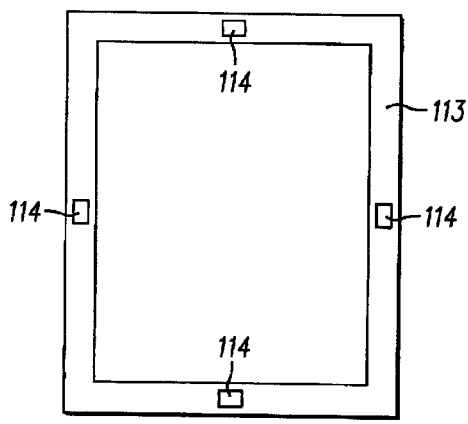
FIG. 1 is a schematic top view of a frame according to a first embodiment of the invention.

According to one embodiment of the invention, an arrangement for transferring a pattern from a mask to a wafer is provided. The mask comprises a first mask having a product area with a product pattern and a second mask having a service pattern area with a service pattern. The first mask and the second mask are separate units used simultaneously to pattern a layer (i.e. resist) on a wafer.

A useful application of one embodiment is to build the second mask as a mask frame and the first mask as a mask center. Then, the mask frame can contain a kerf (scribe grid or outter perimeter) of the mask and the alignment or test structures can be placed in the kerf. The mask frame can be exchanged independently from the mask center, which, for example, includes a product pattern. If the product pattern changes, then the appropriate alignment or test structures in the kerf can be easily chosen from existing second masks.

Another application of another embodiment, is to build a test mask which has a first mask and a second mask. The first mask having a product area with cutout test field areas in predefined places, and the second mask having at least one test field area being adjustable to and fitting into one of the cutout test field areas. This allows the placement of test structures within an environment of product structures to address loading effects. (Loading effects are typically etch and chemical mechanical polishing processing effects where different processing results (i.e. film removal or uniformity) occur near specific features (i.e. dense or isolated) or regions of the wafer (i.e. edge or center).

According to yet another embodiment, a method for transferring a pattern from a mask to a wafer includes combining a first mask and a second mask to form a combined mask, the first mask has a product area with a product pattern, the second mask at least partly surrounds the first mask and has a service pattern area with a service pattern. The first mask and the second mask are separate units which are aligned to each other. The combined mask is aligned and light is projected through the combined mask and projected onto the wafer to form a pattern in a layer formed over the wafer.

According to the invention, an apparatus for lithography includes a mask, which is a combination of a first mask and a second mask, using a first pattern part having a product area with a product pattern; a first blocking part having an opaque area instead of a product area; a second pattern part having a service pattern area with a service pattern; and a second blocking part having an opaque area instead of a service pattern area.

Such an apparatus is employed in a method for transferring a pattern from a mask to a wafer, the method includes exposing the wafer through a combination of the first pattern part and the second blocking part, thereby transferring the product pattern onto the wafer, and exposing the wafer through a combination of the first blocking part and the second pattern part, thereby transferring the service pattern onto the wafer.

This apparatus and/or method provides a set of masks with test structures and a separate single mask or set of masks with product structures, whereby for each mask with product structures a suitable mask with test structures can be chosen, and experimental optimization (choosing) can be performed without manufacturing a new mask for each choosing trial (experiment).

Figure 2:
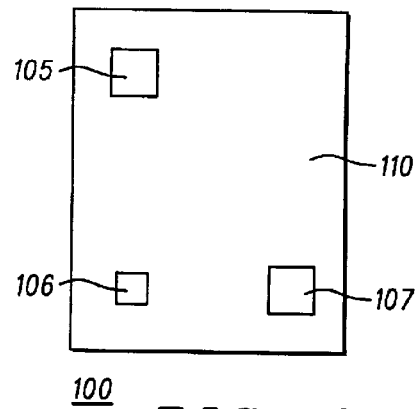
FIG. 2 is a schematic top view of a mask according to the first embodiment of the invention.
Figure 3:
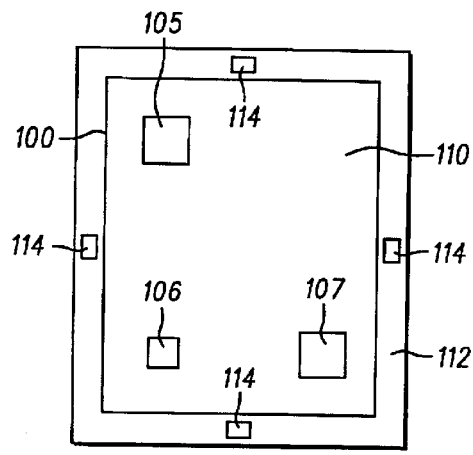
FIG. 3 is a schematic top view of an arrangement according to the first embodiment of the invention.

FIG. 1, FIG. 2, and FIG. 3 illustrate a first embodiment of the invention.

FIG. 1 is a schematic top view of a first mask 112, a kerf or frame mask. The first mask 112 has a kerf 113, which includes service pattern areas (alignment marks areas) 114 having a service pattern (alignment marks). In a preferred embodiment, the service pattern comprises at least one mask alignment mark for aligning the mask to the wafer. Preferably, the service pattern comprises test circuit structure, resolution test structure, or test structures for optical proximity correction. In a preferred embodiment, the first mask 112 includes a multitude of alignment marks to allow use by many different exposure tools.

The first mask 112 forms a frame for a second mask 100, shown in FIG. 2. The second mask 100 has a product area 110 and no kerf region. The product area 100 has a product pattern of features 105, 106, and 107. The features 105, 106, 107 can be any active features, dummy features, etc. for a semiconductor device, and need not be the same as each other. Additionally, any number of features 105, 106, and 107 can be present in any pattern and any shape. In other words, the pattern and shape is not limited by the pattern or shape (i.e. rectangle) shown in the figures. In one embodiment, the features 105, 106 and 107 are all patterns for gate electrodes.

FIG. 3 shows a schematic top view of an arrangement according to the first embodiment, wherein the second mask 100 is held by the first mask 112. In combination, the arrangement has a product area 110 and alignment mark areas 114 in the kerf region 113. Further, the first mask 112 may have parametric test structures (not shown) embedded within it.

Preferably, the first mask 112 and the second mask 100 include mask alignment marks for aligning the first mask 112 and the second mask 100 to each other. In one embodiment, the alignment marks are each a square centered inside a larger square, a group of rectangles in an array, a plus-sign or cross centered inside a square, the like or combinations of the above.

Figure 4:
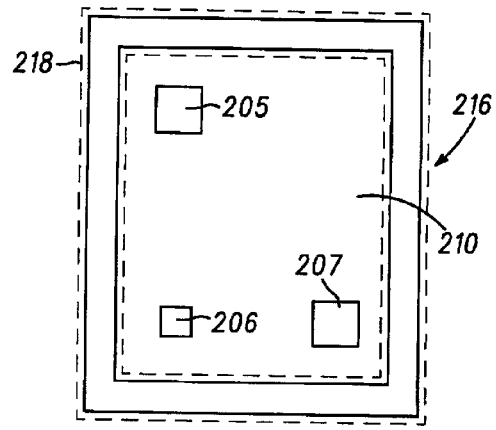
FIG. 4 is a schematic top view of a mask according to a second embodiment of the invention.
Figure 5:
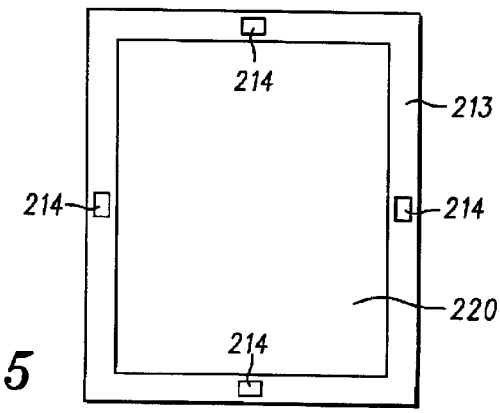
FIG. 5 is a schematic top view of a further mask according to a second embodiment of the invention.

FIG. 4 and FIG. 5 illustrate a second embodiment of the invention.

FIG. 4 shows a mask 200 with a kerf region 216. A product area 210 is provided in the first mask 200 with features 205, 206, 207. (The features 205, 206 and 207 can be any feature discussed for features 105, 106 and 107; they need not be the same as the features 105, 106 and 107 or each other.). In order to apply the concept of the present invention to the first mask 200, which in one embodiment is a prior art mask, a process using a second exposure may be employed. During the first exposure of the wafer through the mask 200 the kerf region 216 is covered by blades 218. The blades 216 are metal plates associated with the tool and are used to expose cover a part of a reticles so only the uncovered part of the reticle is used to expose the underlying semiconductor wafer. Thus, a pattern is only transferred to the product area of the wafer. Then, the mask 200 is removed.

In FIG. 5 a further schematic top view of a mask is shown which comprises of a second mask 212 having a completely opaque inner region 220 and an alignment mask areas 214 in an kerf region 213, as shown in FIG. 4. Such mask is used for the second exposure. After removal of the first mask 200, the second mask 212 is positioned and patterned using the alignment mark areas 214, which are transferred to the kerf region of the wafer. Thus, the effects of, for example, CMP or etching on the various alignment mark styles may be studied. Further, the use of existing reticles is possible for improved alignment by using the second mask 212. Thus, it is not necessary to produce a new reticle for each device level and already existing reticles can be reused.

The invention is particularly advantageous, in regards to testing the effect of new patterns that are printed onto specific areas before a new mask set is built. This largely reduces the costs of the optimization procedure. It prevents a costly reticle set from being produced without knowing if the alignment marks will work in the integrated process. Further, the development time for new devices is reduced, since the production of multiple masks is avoided. Moreover, in the case of prior art masks with an integral kerf region (i.e. the kerf region is on the same mask as the pattern for the semiconductor wafer), there is not enough space within the kerf to layout multiple mark styles. In contrast thereto, an embodiment of the present invention establishes the possibility to provide a multitude of alignment mark styles within one frame. The frame alignment mark features are positioned in the areas where mask alignment mark features are not present. Thus, all processing layer and kerf combinations may be checked with the integrated test procedure. Also an additional confirmation test can be performed. Once the wafer has been exposed through the combination of the mask and the frame, the wafer is etched. After forming a pattern on the semiconductor wafer, the wafer is aligned again aligned to a kerf mask to compare the kerf mask alignment to that of the features in the pattern on the semiconductor wafer, as will be explained in more detail in regards to FIG. 7.

As mentioned above, an embodiment optimizes the alignment marks during experimentation, which is before a device goes into production. More specifically, the optimization of specific alignment marks and test structures for a product can be performed with a set of masks, which have different alignment marks and test structures. Thus, there is no need to make several expensive product-specific test reticles. However, the arrangement according to the invention can also advantageously be used during the production. When used in production, alignment time of a production mask may be decreased by using a kerf mask in conjunction with the production mask to align the production mask.

Figure 6:
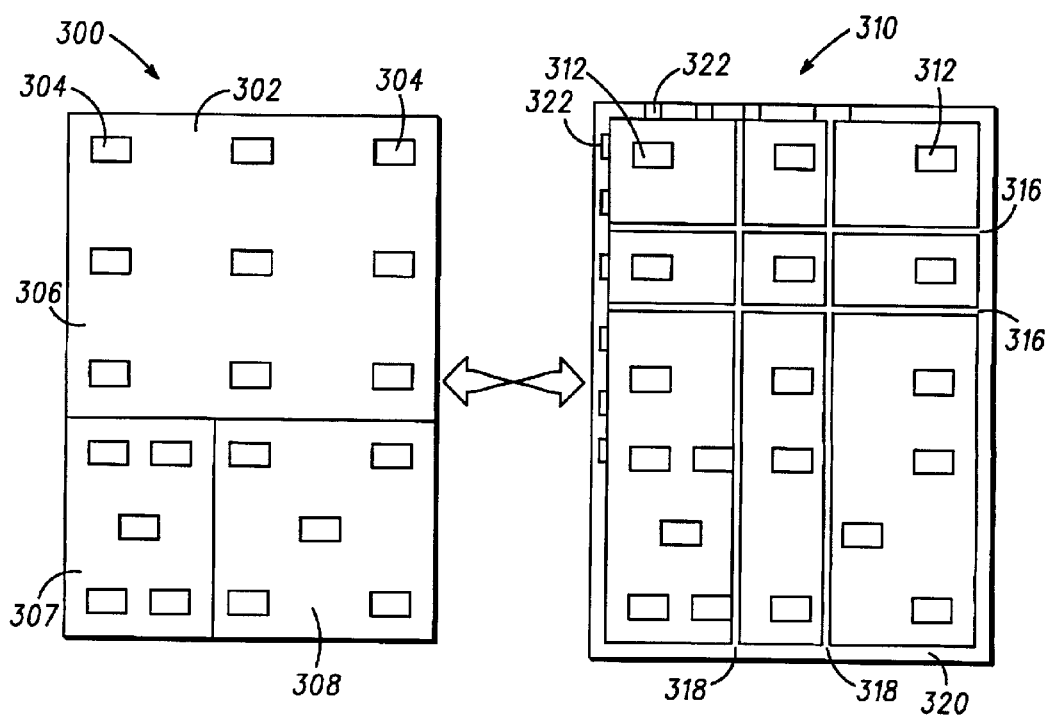
FIG. 6 is a schematic top view of a first and second mask according to another embodiment of the invention.

FIG. 6 is a schematic top view of a first mask 300 and a second mask 310 according to a third embodiment of the invention. The first mask 300 has a product area 302 with cutout test field areas 304 in predefined places, and the second mask 310 has test field areas 312 being adjustable to and fitting into one of the cutout test field areas 304. The combinations of the first mask 300 and the second mask 310 is a test mask used for experimentation purposes to determine the effects of features (e.g. alignment features) for different areas of a device pattern.

Preferably, the first mask 300 comprises several test field areas 304 with different test patterns. Advantageously, the second mask 310 comprises an optical proximity correction test pattern and/or an alignment mark pattern.

The product area 302 of the first mask 300 has several sections 306, 307, 308, each having a different simulation pattern with test structures of a specified density simulating a density of structures of a product to be manufactured. This allows address loading effects to be addressed by placing test structures in areas with a density of structures similar to those of a product to be manufactured.

A selected test pattern of the second mask 310 can be positioned by blades, indicated by horizontal lines 316 and vertical lines 318 to a selected cutout test field area of the first mask 300. Blades are part of the lithography tool that allow light to shine through a defined opening (e.g. a square or rectangle) by presenting unwanted features or mask areas from being images on the wafer.

The second mask 310 has a kerf region 320 with further test areas 322 which in one embodiment are marks used for alignment, conductivity tests, or optical proximity testing.

Figure 7:
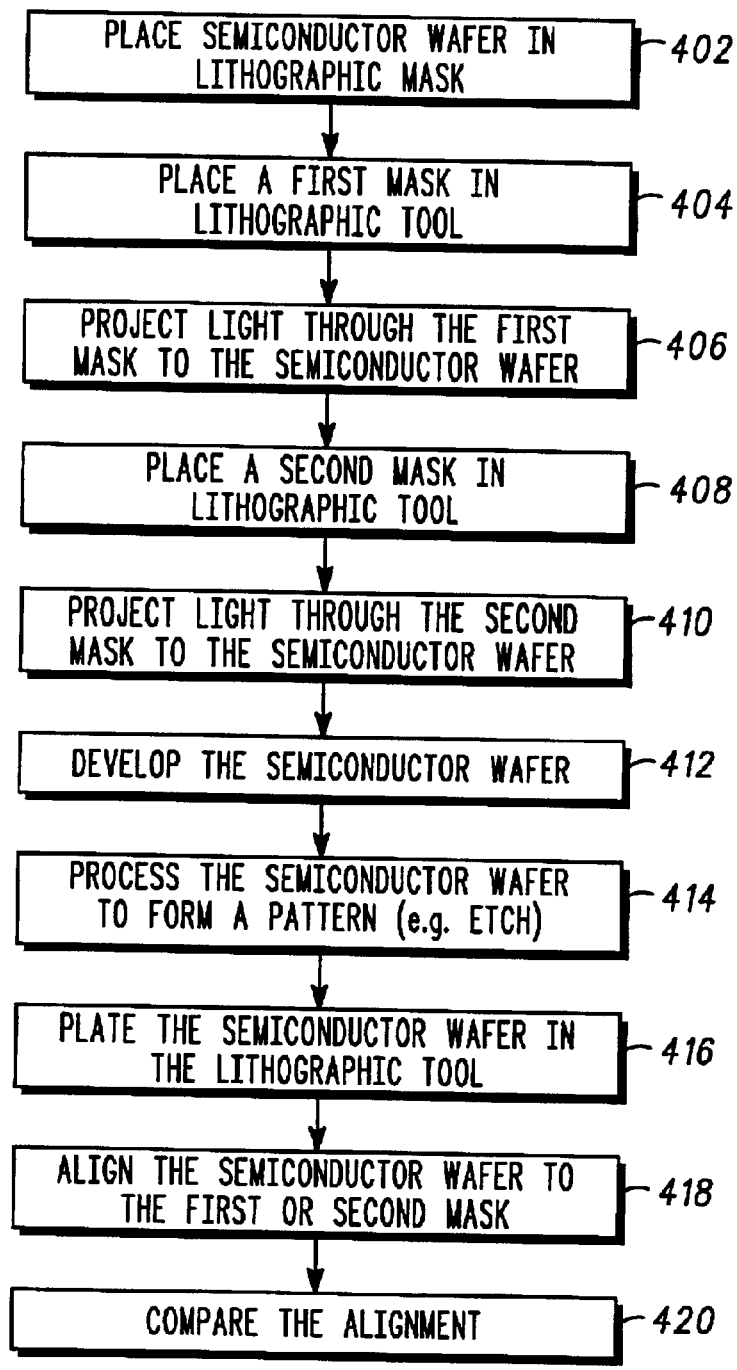
FIG. 7 is a flow diagram of a method according to one embodiment of the invention.

FIG. 7 shows a flow diagram 400 of a method, in accordance with one embodiment, for transferring a pattern from a mask to a wafer, using any of the masks previously described. The method starts by placing 402 a semiconductor wafer in a lithographic tool. The semiconductor wafer includes a first layer (e.g. polysilicon, oxide, etc.) formed over a top surface of the semiconductor wafer and a resist (e.g. photoresist) layer formed over the first layer. In one embodiment, the first layer and the resist layers are the only layers on the semiconductor wafer. In other words, no processes to form a patterned layer have been performed on the semicondcutor layer (i.e. the semiconductor wafer is unpatterned). In this embodiment, the semiconductor wafer does not need to be aligned. In another embodiment, a patterned layer is under the first layer and the resist layer. Therefore, in this embodiment, the semiconductor wafer needs to be aligned, in one embodiment, on the lithographic tool.

After providing the semiconductor wafer, a first mask is placed (404) in the lithographic tool. If the semiconductor wafer is unpatterned, no alignment is necessary. However, if the semiconductor wafer is patterned, the first mask may need to be aligned to the tool, especially if the patterned semiconductor wafer was previously aligned to the tool.

In one embodiment, light is projected 406 through the first mask to the semiconductor wafer after providing (and optionally, aligning) the first mask. Light can be projected by using a convention photolithographic tool as known to a skilled artisan. After projecting light through the first mask, a second mask is placed 408 in the lithographic tool. Similar to the first mask, the second mask may be aligned; it is not necessary if the semiconductor wafer is not patterned. After providing the second mask, light is projected 410 through the second mask.

In one embodiment, the first mask or the second mask has a pattern area with pattern features (and optionally alignment and test features) with no kerf region and the other mask has a kerf region with alignment features (and optionally test features) and no center portion. In another embodiment, the mask with the pattern features has a kerf region, but blades are used to block the kerf region of this mask. Therefore, one mask can serve as the kerf region for the other mask.

In an alternative embodiment, light can be projected simultaneously through the first mask and the second mask. In this embodiment, the first mask and the second mask are aligned to each other (in one embodiment, by aligning each to the lithographic tool) to form a combined mask. In this embodiment, light is projected through the combined mask.

After projecting light through both masks (simultaneously or in separate processing steps), the resist on the semiconductor wafer is developed 412 so that the pattern imaged on the resist can be used as a mask in subsequent processing. (A skilled artisan recognizes that additional conventional processes not described, such as a post-exposure bake, may also be performed.) After developing the resist, the semiconductor wafer is processed 414 to from a pattern in the first layer. In one embodiment, the resist pattern is transferred to the first layer by an etch process.

After forming the pattern in the first layer, the semicondcutor wafer is placed 416 in the lithographic tool and then aligned 418 to the first mask, the second mask, or the combined mask, which ever mask has the kerf region with the aligment marks used to form the pattern in the resist layer by projecting light through it. The aligment of the mask with the pattern in the first layer is compared 420.

In one embodiment, the effectiveness of the alignment is determined by using a separate optical metrology tool. If the alignment mark being analyzed is a square centered inside a square, for example, the distance from each side of the centered square to the outlying square is measured. If each of the four distances is equal to the others, then perfect (100%) alignment is achieved.

In another embodiment, a signal measured by the lithographic tool is examined to determine the effectiveness of the alignment. The signal is generated from the alignment marks and, in one embodiment, is a reflectance of a signal (i.e. light) incident on the alignment marks. Generally, a desired signal has repeated maximums that are substantially equally spaced and have substantially the same widths. An undesired signal deviates from the desired signal by having maximums that are spaced apart at different intervals and/or have different widths.

In a preferred embodiment, the both methods above and similar methods are used to determine the alignment effectiveness. If the resulting alignment does not meet a predetermined level or value, than different alignment marks should be used. The predetermined level or value will may be different for different layers of the semiconductor wafer and different tools, because the predetermined level or alignment depends on how critical alignment is for a specific aspect of a design.

In accordance with one embodiment, it is possible to use a normal device reticle without any kerf region built on a first mask 100. For optimizing the alignment, the reticle is mounted to a second mask 112 built as a frame that acts as a holder for the reticle. The frame does not interfere with the product area 110 of the reticle. Further, there are alignment marks embedded within the frame (i.e. first mask 112). Thus, any device reticle can be combined with any frame, so that an optimization of the alignment mark for the particular device structure and for the particular process steps during production of the device may be obtained.

Preferably, the frame 112 has various designs of features in a kerf region, to allow testing critical features by the various designs of features in the kerf region.

Preferably, combining the first mask 100 with the frame mask 112 is performed automatically, i.e. without direct interaction by human operator.

While the invention has been described in terms of particular structures, devices and methods, those of skill in the art will understand based on the description herein that it is not limited merely to such examples and that the full scope of the invention is properly determined by the claims that follow.

What is claimed is:

1. A method for transferring a pattern from a mask to a wafer comprising:

combining a first mask and a second mask to form a third mask, the first mask having a product area with a product pattern, the second mask having a service pattern area with a service pattern, the first mask and the second mask being separate units;

aligning the first mask and the second mask to each other;

aligning the combination of the first mask and the second mask to the wafer; and projecting light onto the wafer through the combination of the first mask and the second mask.

2. The method of claim 1, wherein the service pattern is transferred to a kerf region of the third mask.

3. The method of claim 1, wherein the service pattern comprises a mask alignment mark for aligning the third mask to the wafer.

4. The method of claim 1, wherein the service pattern comprises a multitude of mask alignment marks of different styles.

5. The method of claim 1, wherein the service pattern comprises test circuit structures.

6. The method of claim 1, wherein the service pattern comprises resolution test structures.

7. The method of claim 1, wherein the service pattern comprises test structures for optical proximity correction.

8. The method of claim 1, wherein the aligning of the first mask and the second mask to each other uses mask alignment marks of both the first mask and the second mask.

9. The method of claim 1, wherein the second mask is formed as a frame for the first mask.

10. The method of claim 1, wherein the third mask is a test mask, the first mask having a product area with cutout test field areas in predefined places, and the second mask having at least one test field area being adjustable to and fitting into one of the cutout test field areas.

11. The method of claim 10, wherein the second mask comprises several test field areas with different test patterns.

12. The method of claim 10, wherein the second mask comprises one of an optical proximity correction test pattern and/or an alignment mark pattern.

13. The method of claim 10, wherein the first mask comprises a product area having a simulation pattern with test structures of a specified density simulating a density of structures of a product to be manufactured.

14. The method of claim 1, further comprising:

exposing the wafer, developing the wafer using lithography process techniques, aligning the wafer back to the third mask, comparing overlay information, exposing the wafer, developing the wafer using lithography process techniques, aligning the wafer back to the third mask, and comparing overlay information.

15. The method of claim 1, wherein the combining of the first mask and the second mask is performed automatically.

16. A method for transferring a pattern from a mask to a wafer, the mask comprising a combination of a first mask and a second mask, wherein the first mask has a first pattern part having a product area with a product pattern; and a first blocking part having an opaque area instead of a product area; and the second mask has a second pattern part having a service pattern area with a service pattern; and a second blocking part having an opaque area instead of a service pattern area, the method comprising:

exposing the wafer through a combination of the first pattern part and the second blocking part, thereby transferring the product pattern onto the wafer, exposing the wafer through a combination of the first blocking part and the second pattern part, thereby transferring the service pattern onto the wafer.

17. The method of claim 16, further comprising the step exposing the wafer through a combination of an additional first pattern part and the second blocking part, thereby transferring an additional product pattern onto the wafer.

18. The method of claim 16, wherein the first pattern part comprises a product area having a simulation pattern with test structures of a specified density simulating a density of structures of a product to be manufactured.

* * * * *

UNITED STATES PATENT AND TRADEMARK OFFICE
CERTIFICATE OF CORRECTION

PATENT NO. : 6,737,205 B2  
DATED : May 18, 2004  
INVENTOR(S) : John Maltabes et al.

Page 1 of 1

It is certified that error appears in the above-identified patent and that said Letters Patent is hereby corrected as shown below:

<u>Column 8,</u>
Line 6, change "and/or" to -- or --.

Signed and Sealed this

Second Day of May, 2006

JON W. DUDAS
*Director of the United States Patent and Trademark Office*